United States Patent
Liao et al.

(10) Patent No.: US 9,564,098 B2
(45) Date of Patent: Feb. 7, 2017

(54) DISPLAY PANEL, GATE DRIVER AND CONTROL METHOD

(71) Applicant: AU OPTRONICS CORP., Hsinchu (TW)

(72) Inventors: Wei-Chien Liao, Hsin-Chu (TW); Ming-Hung Chuang, Hsin-Chu (TW)

(73) Assignee: AU OPTRONICS CORP., Hsinchu (TW)

( * ) Notice: Subject to any disclaimer, the term of this patent is extended or adjusted under 35 U.S.C. 154(b) by 53 days.

(21) Appl. No.: 14/509,470

(22) Filed: Oct. 8, 2014

(65) Prior Publication Data

US 2015/0228243 A1 Aug. 13, 2015

(30) Foreign Application Priority Data

Feb. 7, 2014 (TW) .............................. 103104128 A

(51) Int. Cl.
*G09G 3/36* (2006.01)
*G11C 19/28* (2006.01)

(52) U.S. Cl.
CPC ............ *G09G 3/3677* (2013.01); *G11C 19/28* (2013.01); *G09G 2310/0286* (2013.01); *G09G 2310/0289* (2013.01)

(58) Field of Classification Search
CPC ...................... G09G 3/3677; G09G 2310/0286; G09G 2310/0289; G11C 19/28
See application file for complete search history.

(56) References Cited

U.S. PATENT DOCUMENTS

| | | | |
|---|---|---|---|
| 7,792,237 B2 | 9/2010 | Chen et al. | |
| 2005/0008114 A1* | 1/2005 | Moon | G09G 3/3677 377/64 |
| 2010/0110047 A1* | 5/2010 | Yoon | G09G 3/3677 345/204 |
| 2012/0139883 A1* | 6/2012 | Lee | G09G 3/3611 345/204 |
| 2013/0135284 A1* | 5/2013 | Tseng | G11C 19/28 345/212 |
| 2014/0160000 A1* | 6/2014 | Ma | G09G 3/3677 345/100 |
| 2014/0168050 A1* | 6/2014 | Gu | G09G 3/3611 345/100 |
| 2014/0355731 A1 | 12/2014 | Chien et al. | |
| 2015/0179277 A1* | 6/2015 | Pai | G09G 3/20 377/68 |

FOREIGN PATENT DOCUMENTS

| CN | 103280198 | 9/2013 |
|---|---|---|
| CN | 103474095 | 12/2013 |

\* cited by examiner

*Primary Examiner* — Ilana Spar
*Assistant Examiner* — Mihir K Rayan
(74) *Attorney, Agent, or Firm* — WPAT, PC; Justin King

(57) ABSTRACT

A display panel, a gate driver and a control method are disclosed herein. The gate driver includes series-coupled driving stages. One of the driving stages includes an input unit and a shift register circuit. The input unit outputs a shift signal to a control node according to a gate driving signal from the previous driving stage and the gate driving signal from the next driving stage. The shift register circuit is electrically coupled to the control node, and outputs the gate driving signal. During the enabling period of the gate driving signal from the previous driving stage and the enabling period of the gate driving signal from the current driving stage, the shift register circuit keeps the voltage level of the control node being at a first voltage.

13 Claims, 11 Drawing Sheets

DISPLAY PANEL, GATE DRIVER AND CONTROL METHOD

This application claims priority to Taiwan Application Serial Number, 103104128, filed Feb. 7, 2014, which is herein incorporated by reference.

BACKGROUND

Technical Field

The present disclosure relates to a display panel. More particularly, the present disclosure relates to a gate driver of a display panel.

Description of Related Art

Recently, liquid crystal displays (LCDs) have been widely applied in various kinds of products. To increase a visible area of LCD, new techniques about a slim border in the LCD keep coming out.

Reference is made to FIG. 1. FIG. 1 is a schematic diagram of a conventional shift register circuit 100 which is a commonly used circuit of the shift register. As shown in FIG. 1, the shifter register circuit 100 is configured to receive a scan control signal CS to change the voltage level of a control node A, so as to generate a gate driving circuit SR_OUT.

Explained in a detailed way, when a previous stage of the shift register circuit 100 outputs the gate driving signal SR_OUT, the control node A in the current stage of the shift register circuit 100 is pulled up to a high level voltage by the scan control signal CS. When the current stage of the shift register circuit 100 outputs the gate driving signal SR_OUT, the control node A is floating. In this present time, the control node A may be charged only by a clock signal CLK/XLCLK through certain parasitic capacitances, and thus the current stage of the shift register circuit 100 can correctly output the gate driving signal SR_OUT.

However, if the threshold voltages of the switches N1-N3 are reduced and the leakage current of the switches N1-N3 are increased due to device aging and/or process variations, the voltage level of the control node A, which is floating, may be not correctly kept at the high level voltage. In other words, when the current stage of the shift register circuit 100 outputs the gate driving signal SR_OUT, the voltage level of the control node A may be changed to a voltage with a higher level by the clock signal CLK/XCLK. Alternatively, the voltage level of the control node A may be pulled down to the low level voltage when the leakage current is too large. As a result, the operations of the shift register circuit 100 are failure.

Therefore, a heretofore-unaddressed need exists to address the aforementioned deficiencies and inadequacies.

SUMMARY

An aspect of the present disclosure is to provide a display panel. The display panel includes gate lines and a gate driver. The gate driver includes series-connected driving stages. Each of the driving stages is configured to output a gate driving signal to the corresponding one of the gate lines, in which a N-th driving stage of the driving stages includes an input unit and a shift register circuit. The input unit is configured to output a shift signal to a control node according to the gate driving signal outputted from a (N−1)th driving stage and the gate driving signal outputted from a (N+1)th driving stage, in which N is a positive integer. The shift register circuit is electrically coupled to the control node, and configured to receive the shift signal to output the gate driving signal. The shift register circuit keeps the voltage level of the control node being at a first voltage during the enabling period of the gate driving signal outputted from the (N−1)th driving stage and the enabling period of the gate driving signal outputted from the N-th driving stage.

Another aspect of the present disclosure is to provide a gate driver. The gate driver includes series-connected driving stages. Each of the driving stage includes an input unit having an output terminal, and a shift register circuit. The shift register circuit includes a first switch, a second switch, a third switch, a fourth switch, a fifth switch, a sixth switch, a seventh switch, and an output unit. A control terminal of the first switch is electrically coupled to the output terminal of the input unit, and a first terminal of the first switch is configured to receive a first voltage. A control terminal of the second switch is electrically coupled to the second terminal of the first switch, and a first terminal of the second switch is electrically coupled to the first terminal of the first switch. A control terminal of the third switch is electrically coupled to the output terminal of the input unit, a first terminal of the third switch is electrically coupled to the second terminal of the first switch, and a second terminal of the third switch is configured to receive a second voltage. A control terminal of the fourth switch is electrically coupled to the output terminal of the input unit, a first terminal of the fourth switch is electrically coupled to the second terminal of the second switch, and a second terminal of the fourth switch is configured to receive the second voltage. A control terminal of the fifth switch is electrically coupled to the second terminal of the first switch, a first terminal of the fifth switch is electrically coupled to the first terminal of the first switch, and a second terminal of the fifth switch is electrically coupled to the output terminal of the input unit. A control terminal of the sixth switch is electrically coupled to the second terminal of the second switch, a first terminal of the sixth switch is electrically coupled to the output terminal of the input unit, and a second terminal of the sixth switch is configured to receive the second voltage. A control terminal of the seventh switch is electrically coupled to the first terminal of the fourth switch, a first terminal of the seventh switch is configured to output a gate driving signal, and a second terminal of the seventh switch is configured to receive a power signal. An input terminal of the output unit is electrically coupled to the output terminal of the input unit, and an output terminal of the output unit is electrically coupled to the first terminal of the seventh switch.

Another aspect of the present disclosure is to provide a control method, which is suitable for a gate driver. The gate driver includes series-connected driving stages, and each of the driving stages includes an input unit and a shift register circuit, the input unit and the shift register circuit are electrically coupled to a control node, and the shift register circuit is configured to output a gate driving signal. The control method includes following steps: turning on the input unit to transmit a downshift signal to the control node by the gate driving signal outputted from a previous driving stage; turning on a first switch of the shift register circuit to transmit a first voltage to turn on a second switch by the downshift signal; pulling up the voltage level of the control node to a second voltage through the second switch during the enabling period of the gate driving signal outputted from the previous driving stage; and keeping the voltage level of the control node being at the second voltage through the second switch during the enabling period of the gate driving signal outputted from a current driving stage.

In summary, the display panel, the gate driver, and the control method of the present disclosure can make the nodes of the internal circuits of the gate driver keep at a specific voltage during the operations, and the failed operation caused by floating voltage is thus prevented.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
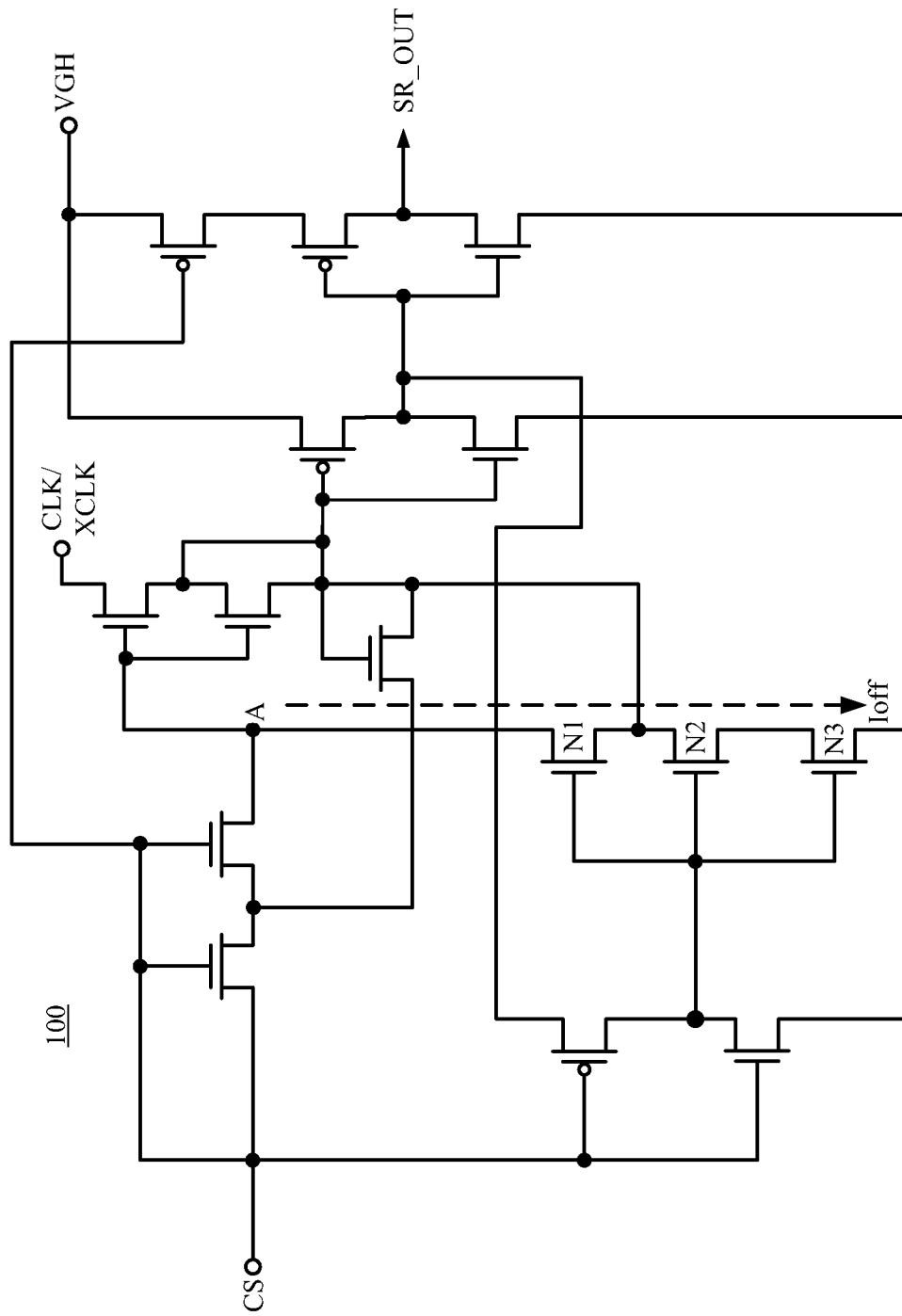
FIG. 1 is a schematic diagram of a conventional shift register circuit.

Reference will now be made in detail to the present embodiments of the invention, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In this document, the term "coupled" may also be termed as "electrically coupled", and the term "connected" may be termed as "electrically connected". "Coupled" and "connected" may also be used to indicate that two or more elements cooperate or interact with each other.

Figure 2:
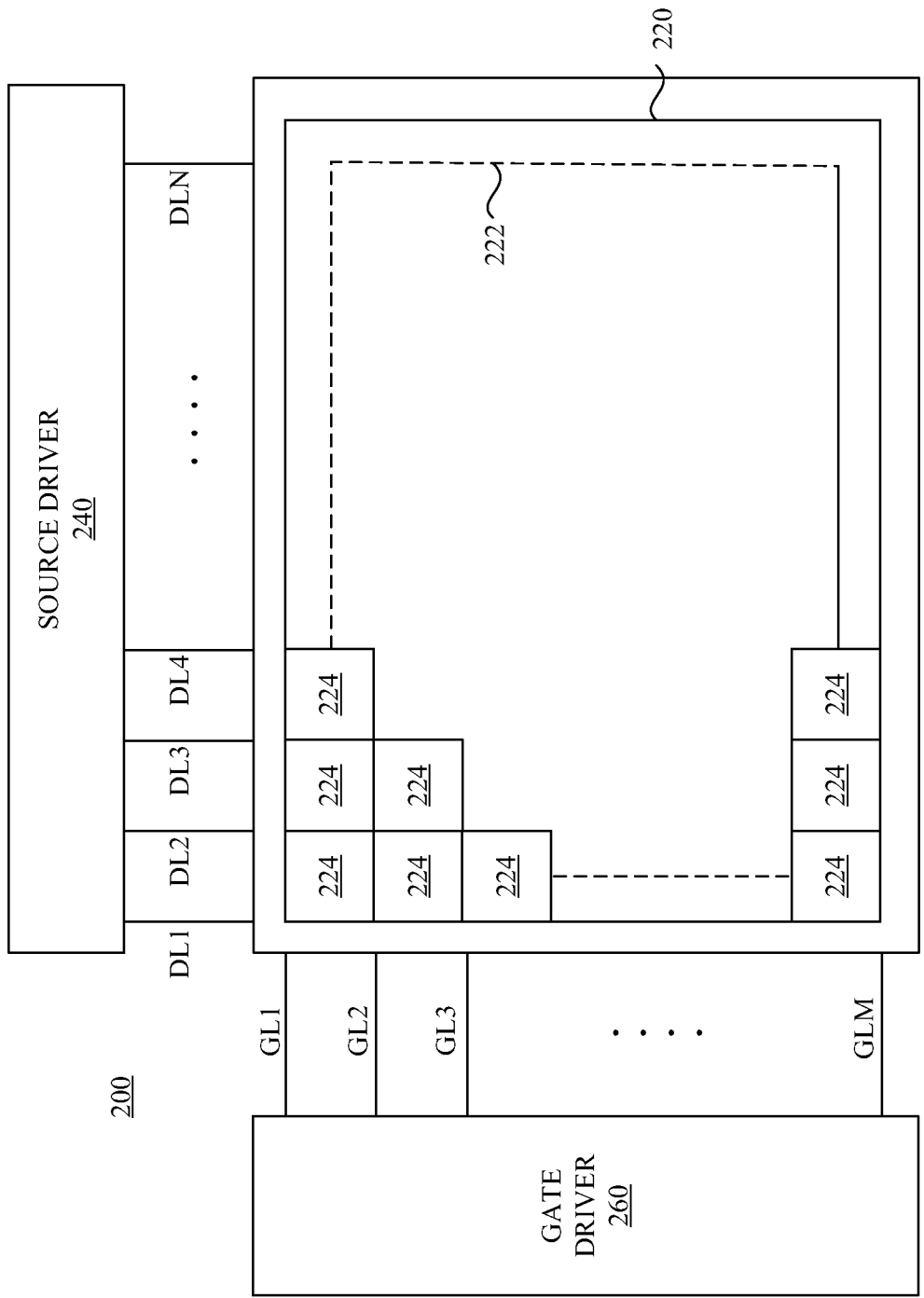
FIG. 2 is a schematic diagram of a display panel according to one embodiment of the present disclosure.

FIG. 2 is a schematic diagram of a display panel according to one embodiment of the present disclosure. As shown in FIG. 2, the display panel 200 includes a video display area 220, a source driver 240 and a gate driver 260. The display area 220 includes a pixel array 222, which is formed by data lines (e.g., N data lines DL1-DLN) and gate lines (e.g., M gate lines GL1-GLM) and pixels 224 that are disposed in the pixel array 222.

The source driver 240 is coupled to the data lines DL1-DLN, and is configured to transmit data signals to the corresponding pixel 224 of the video display area 220 through the data lines DL1-DLN. The gate driver 260 is coupled to the gate lines GL1-GLM, and is configure to sequentially transmit gate-driving signals to the corresponding pixel 224 of the video display area 220 through the gate lines GL1-GLM.

Figure 3:
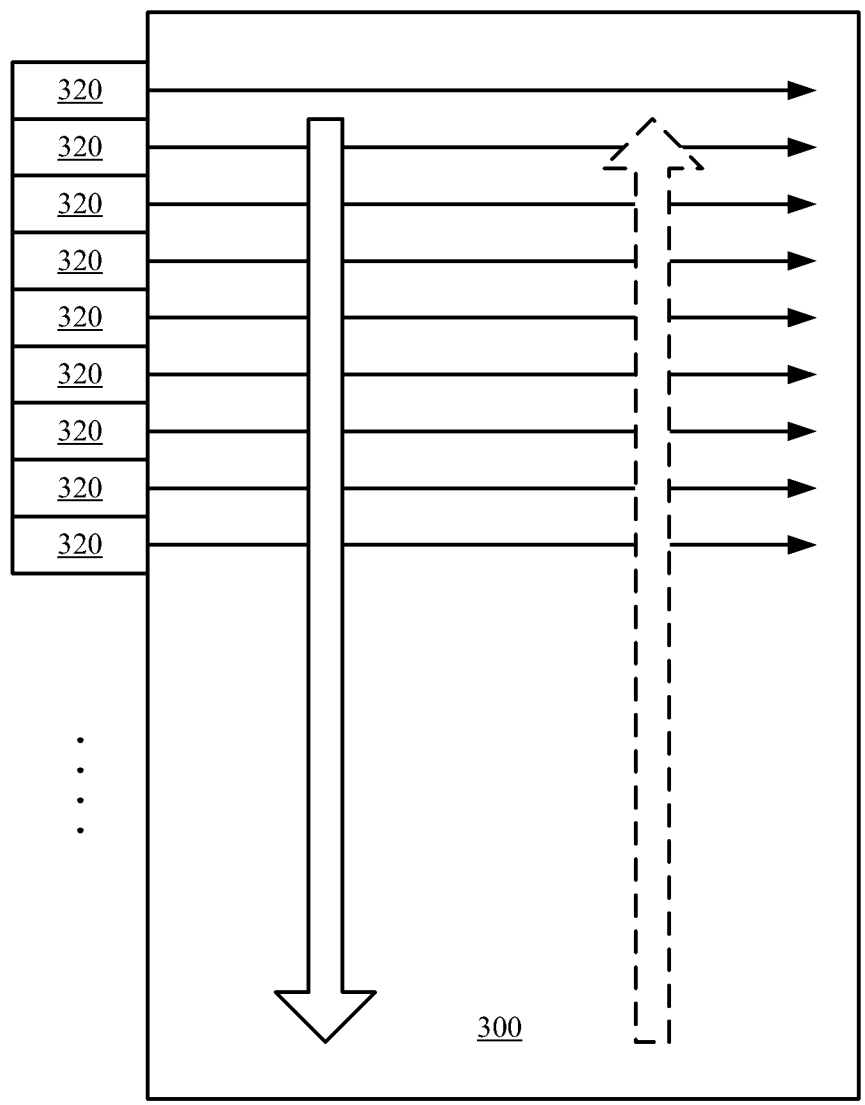
FIG. 3 is a schematic diagram illustrating the configuration of the video display area and the gate driver of a display panel according one embodiment of the present disclosure

FIG. 3 is a schematic diagram illustrating the configuration of the video display area and the gate driver of a display panel according one embodiment of the present disclosure. The illustrated configuration can be applied to the display panel 200 shown in FIG. 2, but not limited thereto. As shown in FIG. 3, the gate driver 260 includes driving stages 320. In this embodiment, the driving stages 320 are disposed at the left side of the video display area 300. In another embodiment, the driving stages 320 are disposed at the right side of the video display area 300. In this embodiment, the driving stages 320 sequentially output the gate driving signals from top to bottom to drive the gate lines GL1-GLM. In another embodiment, the driving stages 320 sequentially output the gate driving signals from bottom to top to drive the gate lines GL1-GLM.

Figure 4:
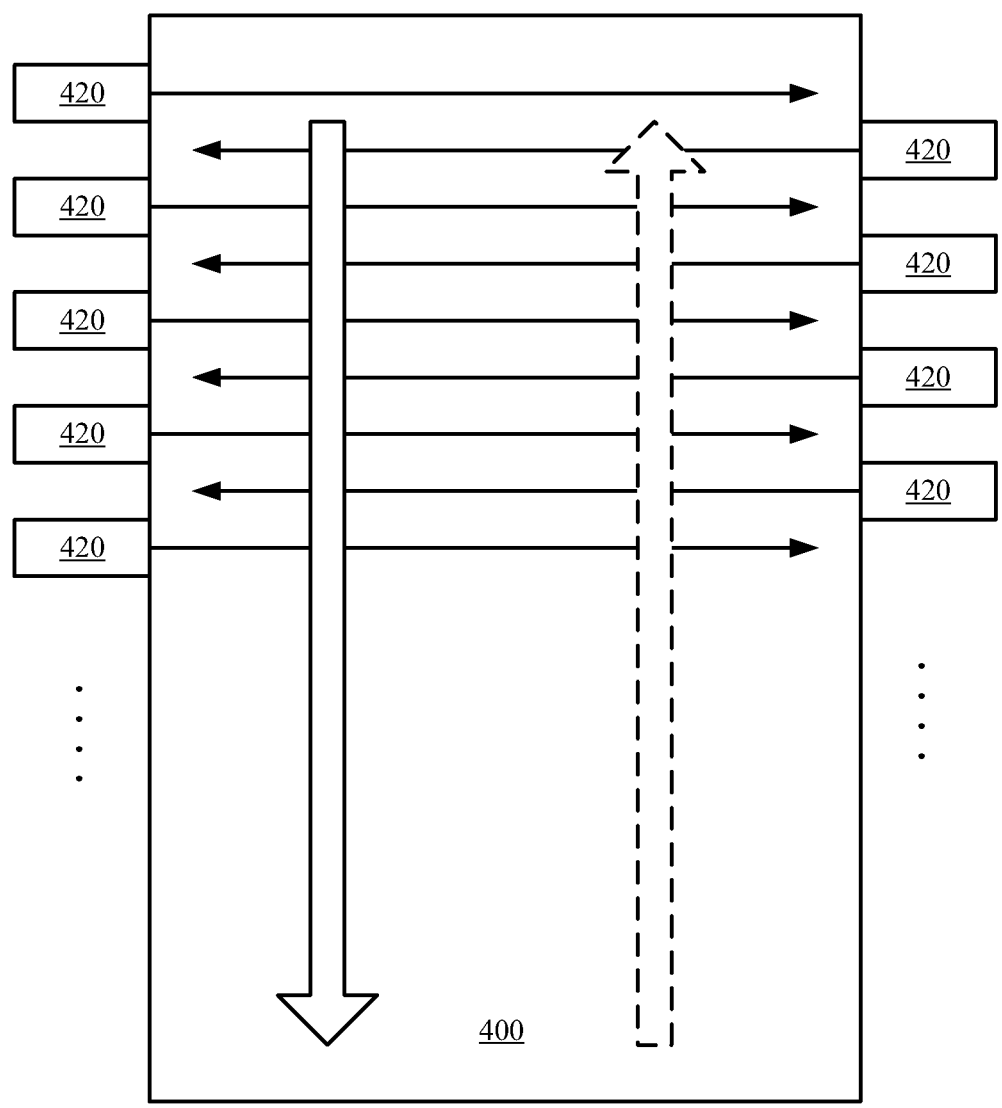
FIG. 4 is a schematic diagram illustrating the configuration of the video display area and the gate driver of a display panel according another one embodiment of the present disclosure.

FIG. 4 is a schematic diagram illustrating the configuration of the video display area and the gate driver of a display panel according another one embodiment of the present disclosure. The illustrated configuration can be applied to the display panel 200 shown in FIG. 2, but not limited thereto. As shown in FIG. 4, the gate driver includes driving stages 420, in which some of the driving stages 420 are disposed at the left side of the video display area 400, and the rest of the driving stages 420 are disposed at the right side of the video display area 400. Both sides of the driving stages 420 are configured to alternatively output the gate driving signals to drive the gate lines. This configuration is called as a dual-sided driving. In one embodiment, both sides of the driving stages 420 are configured to alternatively output the gate driving signals from top to bottom to drive the gate lines GL1-GLM. In another embodiment, both sides of the driving stages 420 are configured to alternatively output the gate driving signals from bottom to top to drive the gate lines GL1-GLM.

Figure 5:
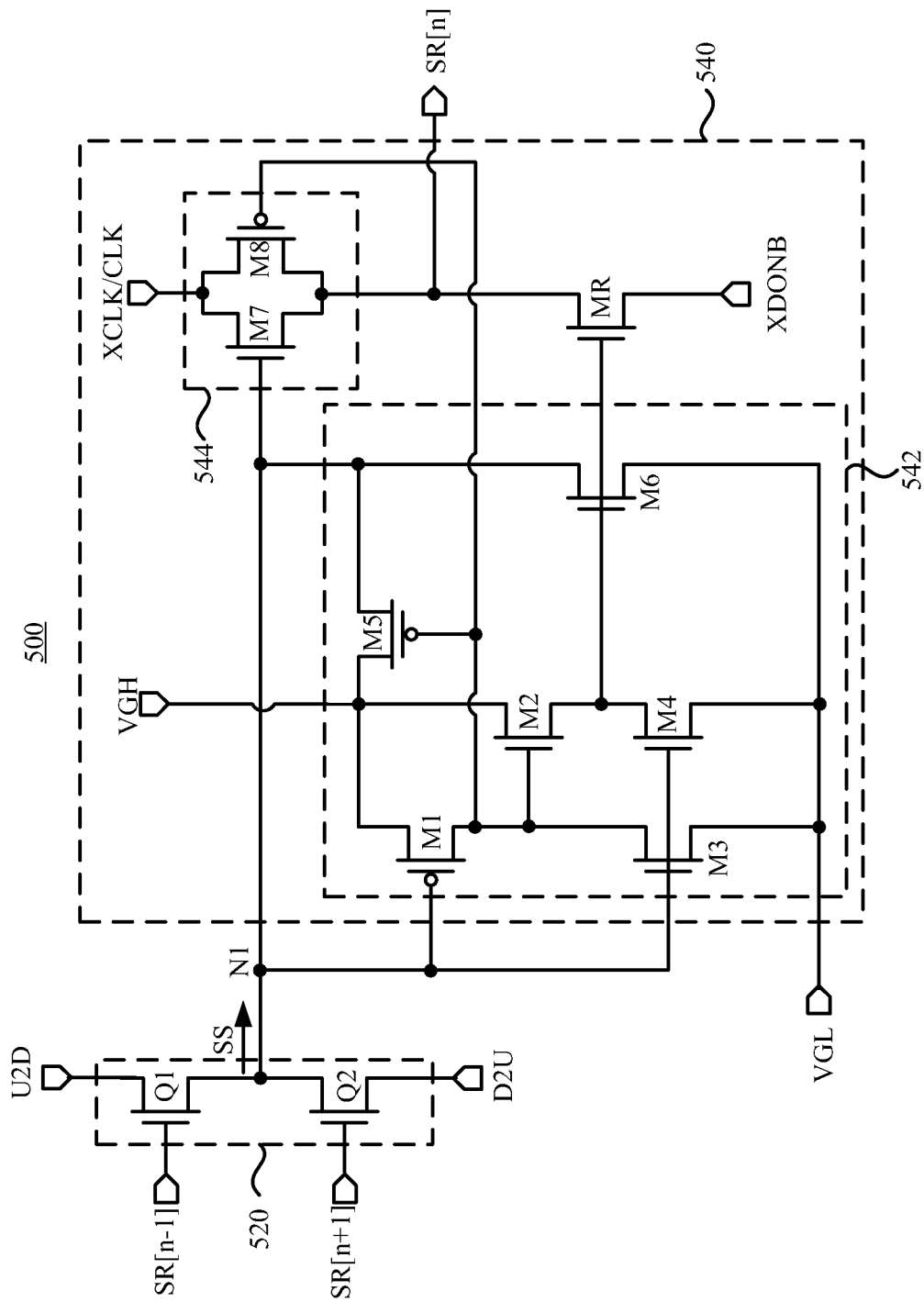
FIG. 5 is a schematic diagram of the N-th driving stage of a gate driver according to one embodiment of the present disclosure.

FIG. 5 is a schematic diagram of the N-th driving stage of a gate driver according to one embodiment of the present disclosure. As shown in FIG. 5, the N-th driving stage 500 can be applied to one of the driving stages shown in FIG. 3 or FIG. 4, but not limited thereto. The N-th driving stage 500 includes an input unit 520 and a shift register circuit 540, in which N is a positive integer.

The input unit 520 is configured to output a shift signal SS to a control node N1 (e.g., an output terminal of the input unit 520), according to the gate driving signal SR[n−1] outputted from the (N−1)th driving stage 500 and the gate driving signal SR[n+1] outputted from the (N+1)th driving stage 500.

The shift register circuit 540 is electrically coupled to the control node N1, and is configured to output the gate driving signal SR[n]. In this embodiment, the shift register circuit 540 can keep the voltage level of the control node N1 being at the voltage VGH during the enabling period (e.g. time T1 illustrated in FIG. 7) of the gate driving signal SR[n−1] outputted from the (N−1)th driving stage 500, and the enabling period (e.g. time T2 illustrated in FIG. 7) of the gate driving signal SR[n+1] outputted from the (N+1)th driving stage 500. As a result, the driving stages 500 can correctly perform driving operations even the leakage currents of the driving stages 500 are increased by the device aging and/or process variations.

The following paragraphs provide certain embodiments related to the driving stage 500 to illustrate functions and applications thereof. However, the present disclosure is not limited to the following embodiments.

In one embodiment, as shown in FIG. 5, the shift register circuit 540 includes a control unit 542, a reset switch MR, and an output unit 544. The control unit 542 is configured to pull up the control node N1 to the voltage VGH or pull down the control node N1 to the voltage VGL according to the shift signal SS. The reset switch is electrically coupled to the control unit 542. In a normal operation, the power signal XDONB is a low voltage level signal (e.g. the level of the voltage VGL). In a power-off state, the power signal XDONB switches to a high voltage level signal (e.g. the level of the voltage VGH), and the reset switch MR switches the gate driving signal SR[n] to the high voltage level signal according to the power signal XDONB, and the pixels 224 are thus reset.

In addition, the voltage VGH and the voltage VGL shown in FIG. 5 are different, and the level of the voltage VGH is higher than the level of the voltage VGL. The clock signal CLK received by the (N−1)th driving stage 500 and the (N+1)th driving stage 500, e.g., the clock signal CLK shown in FIG. 7 later, and the clock signal XCLK received by the N-th driving stage 500 have opposite-phase.

Specifically, as shown in FIG. 5, a first terminal of the reset switch MR is configured to output the gate driving signal SR[n], a second terminal of the reset switch MR is configured to receive the power signal XDONB. The control unit 542 includes a switch M1, a switch M2, a switch M3, a switch M4, a switch M5, and a switch M6. A control terminal of the switch M1 is electrically coupled to the control node N1, and a first terminal of the switch M1 is configured to receive the voltage VGH. A control terminal of the switch M2 is electrically coupled to a second terminal of the switch M1, a first terminal of the switch M2 is electrically coupled to the first terminal of the switch M1, and a second terminal of the switch M2 is electrically coupled to the control terminal of the reset switch MR. A control terminal of the switch M3 is electrically coupled to the control node N1, a first terminal of the switch M3 is electrically coupled to the second terminal of the switch M1, and a second terminal of the switch M3 is configured to receive the voltage VGL. A control terminal of the switch M4 is electrically coupled to the control node N1, a first terminal of the switch M4 is electrically coupled to the second terminal of the switch M2, and a second terminal of the switch M4 is configured to receive the voltage VGL. A control terminal of the switch M5 is electrically coupled to the second terminal of the switch M1, a first terminal of the switch M5 is electrically coupled to the first terminal of the switch M1, and a second terminal of the switch M5 is electrically coupled to the control node N1. A control terminal of the switch M6 is electrically coupled to the second terminal of the switch M2, a first terminal of the switch M6 is electrically coupled to the control node N1, and a second terminal of the switch M6 is configured to receive the voltage VGL.

Furthermore, the output unit 544 includes a switch M7 and a switch M8. A control terminal (i.e., the input terminal of the output unit 544) of the switch M7 is electrically coupled to the control node N1, a first terminal of the switch M7 is configured to receive the clock signal XCLK, and a second terminal (i.e., the output terminal of the output unit 544) of the switch M7 is electrically coupled to the first terminal of the reset switch MR. A control terminal of the switch M8 is electrically coupled to the second terminal of the switch M1, a first terminal of the switch M8 is configured to receive the clock signal XCLK, and a second terminal of the switch M6 is electrically coupled to the first terminal of the reset switch MR.

In this embodiment, the input unit 520 includes a switch Q1 and a switch Q2. A control terminal of the switch Q1 is configured to receive the gate driving signal SR[n−1] outputted from the (N−1)th driving stage 500, a first terminal of the switch Q1 is configured to receive a downshift signal U2D, and a second terminal of the switch Q1 is configured to output the shift signal SS to the control node N1. A control terminal of the switch Q2 is configured to receive the gate driving signal SR[n+1] outputted from the (N+1)th driving stage 500, a first terminal of the switch Q2 is electrically coupled to the second terminal of the switch Q1, and a second terminal of the switch Q2 is configured to receive a upshift signal D2U.

In practical applications, the operation of sequentially driving the gate lines from bottom to top illustrated in FIG. 3 and the operation of sequentially driving the gate lines from top to bottom illustrated in FIG. 4 can be performed by configuring the downshift signal U2D and the upshift signal D2U according to the requirements of the practical applications. In this embodiment, the downshift signal U2D is a high level voltage signal, and the upshift signal D2U is a low level voltage signal, but the present disclosure is not limited thereto. One of person having ordinary skill in the art can adjust the downshift signal U2D and the upshift signal D2U according to the circuit architecture.

Figure 6:
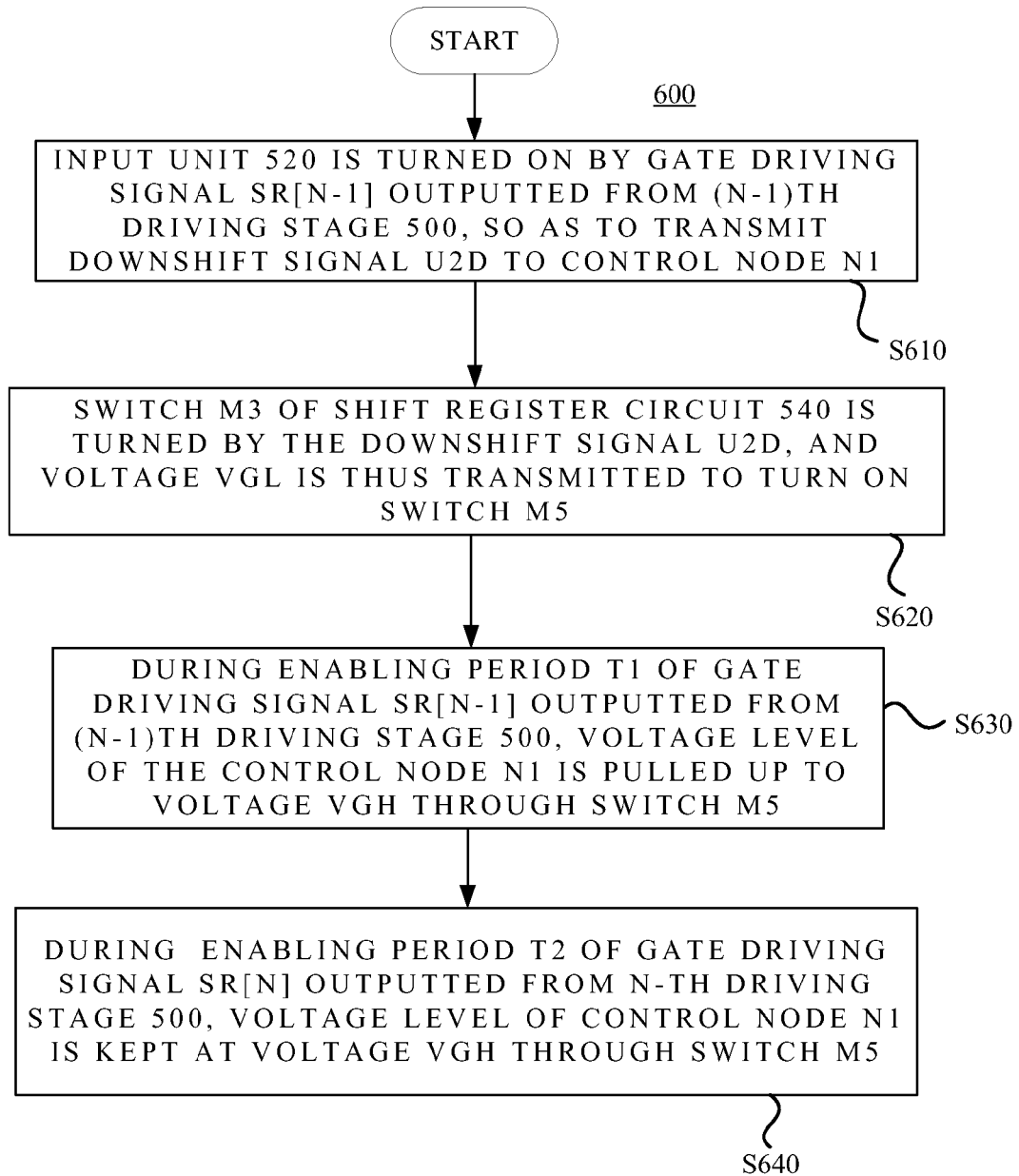
FIG. 6 is a flow chart of a control method according to one embodiment of the present disclosure.
Figure 7:
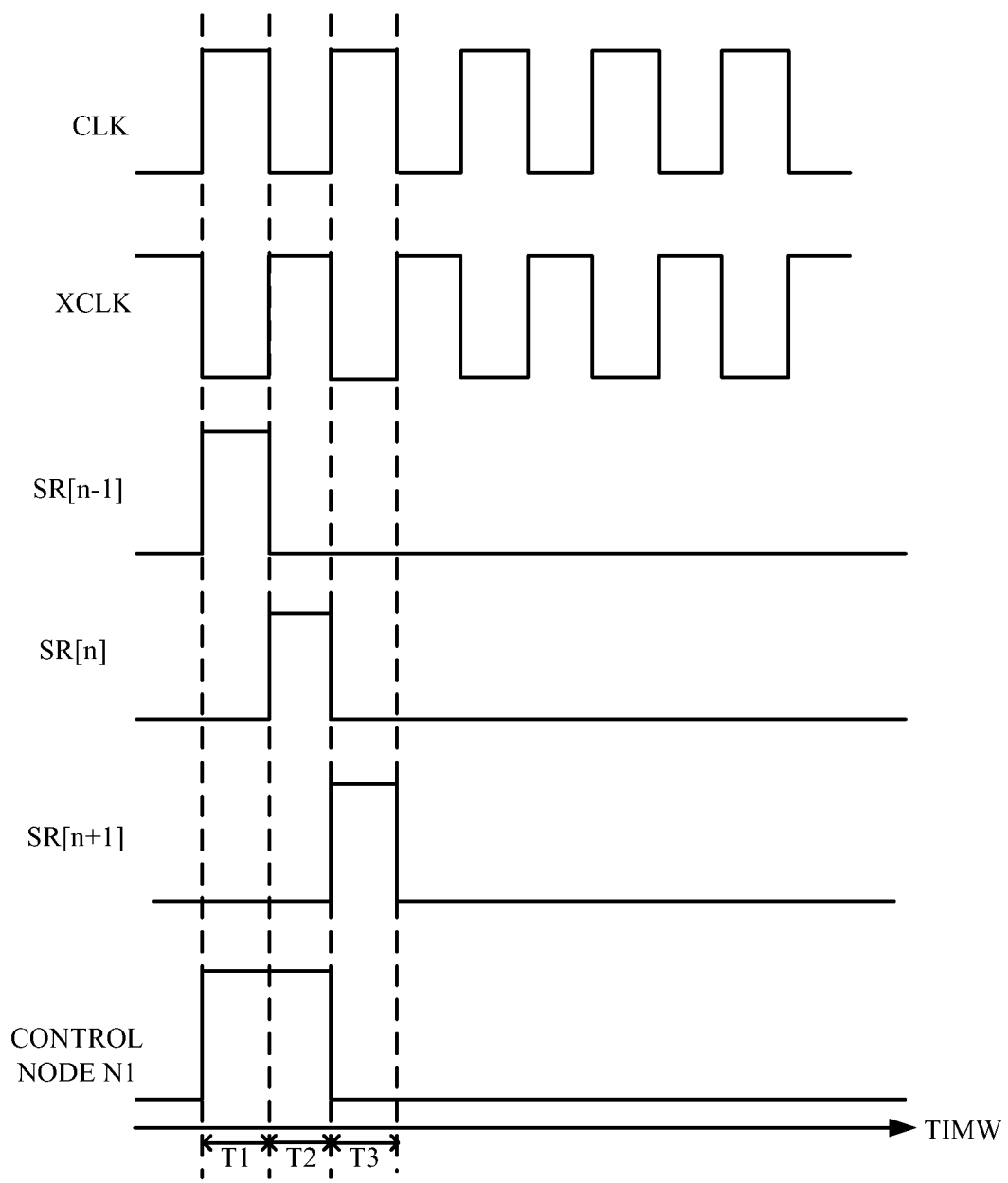
FIG. 7 is a timing diagram of the signals when the driving stage 500 operates the control method according to one embodiment of the present disclosure.
Figure 8A:
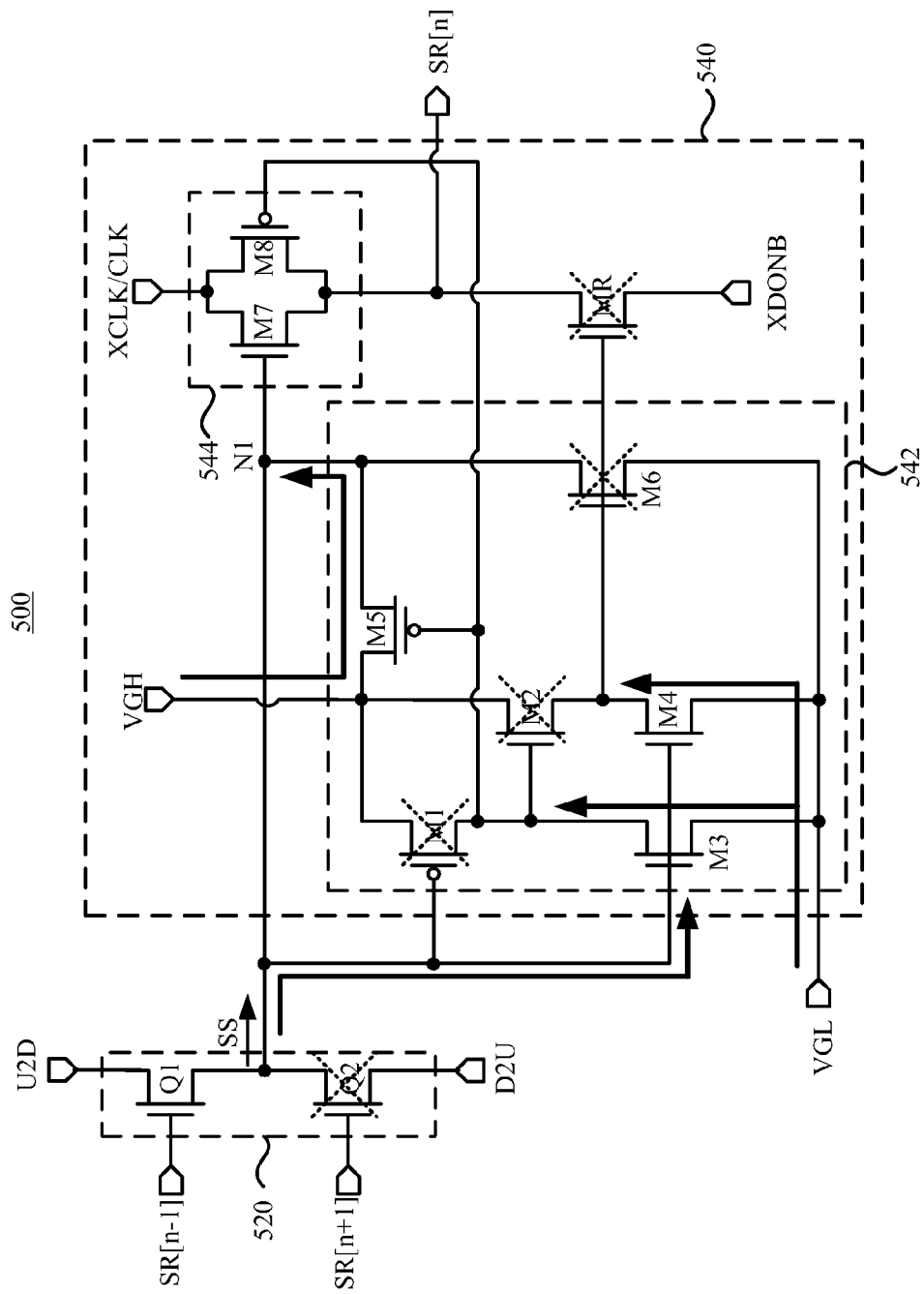
FIG. 8A is a schematic diagram of the state of each switch of the driving stage in FIG. 5 during time T1 according to one embodiment of the present disclosure.

FIG. 6 is a flow chart of a control method 600 according to one embodiment of the present disclosure. The control method 600 can be applied to the gate driver 260 and the driving stages 500 thereof, but not limited thereto. FIG. 7 is a timing diagram of the signals when the driving stage 500 operates the control method 600 according to one embodiment of the present disclosure. FIG. 8A is a schematic diagram of the state of each switch of the driving stage in FIG. 5 during time T1 according to one embodiment of the present disclosure. For simplifying description, reference is made to FIG. 6, FIG. 7, and FIG. 8A, and the operations of the driving stages 500 are described with the control method 600.

The control method 600 includes step S610, step S620, step S630, and step S640. In step 610, the input unit 520 is turned on by the gate driving signal SR[n−1] outputted from the (N−1)th driving stage 500, so as to transmit the downshift signal U2D to the control node N1.

In step S620, the switch M3 of the shift register circuit 540 is turned by the downshift signal U2D, and the voltage VGL is thus transmitted to turn on the switch M5.

In step S630, during the enabling period T1 of the gate driving signal SR[n−1] outputted from the (N−1)th driving stage 500, the voltage level of the control node N1 is pulled up to the voltage VGH through the switch M5.

In the step S640, during the enabling period T2 of the gate driving signal SR[n] outputted from the N-th driving stage 500, the voltage level of the control node N1 is kept at the voltage VGH through the switch M5.

For illustration, as shown in FIG. 7 and FIG. 8A, during time T1, the gate driving signal SR[n−1] outputted from (N−1)th driving stage is at the enabling period (i.e., the time of being at the high level voltage), and the gate driving signal SR[n+1] outputted from (N+1)th driving stage is at the disabling period (i.e., the time of being at the low level voltage). Therefore, the switch Q1 of the input unit 520 is turned on, and the switch Q2 of the input unit 520 is turned off, and the downshift signal U2D is outputted to the control node as the shift signal SS.

As mentioned above, as the downshift signal U2D is the high level voltage signal (not shown), the shift signal SS also is the high level voltage signal in this time. Therefore, the switch M1 is turned off, and the switch M3, the switch M4, and the switch M7 are turned on. The voltage VGL is transmitted to the control terminals of the switch M6 and the reset switch MR through the switch M4, and the switch M6 and the reset switch MR are thus turned off. The voltage VGL is also transmitted to the control terminals of the switch M5 and the switch M8 through the switch M3, and the switch M5 and the switch M8 are thus turned on. The gate driving signal SR[n] outputted from the N-th driving stage 500 follows the clock signal XCLK to be the low level voltage signal. Moreover, during time T1, the voltage level of the control node N1 can be steadily pulled up to the voltage VGH through the switch M5.

Figure 8B:
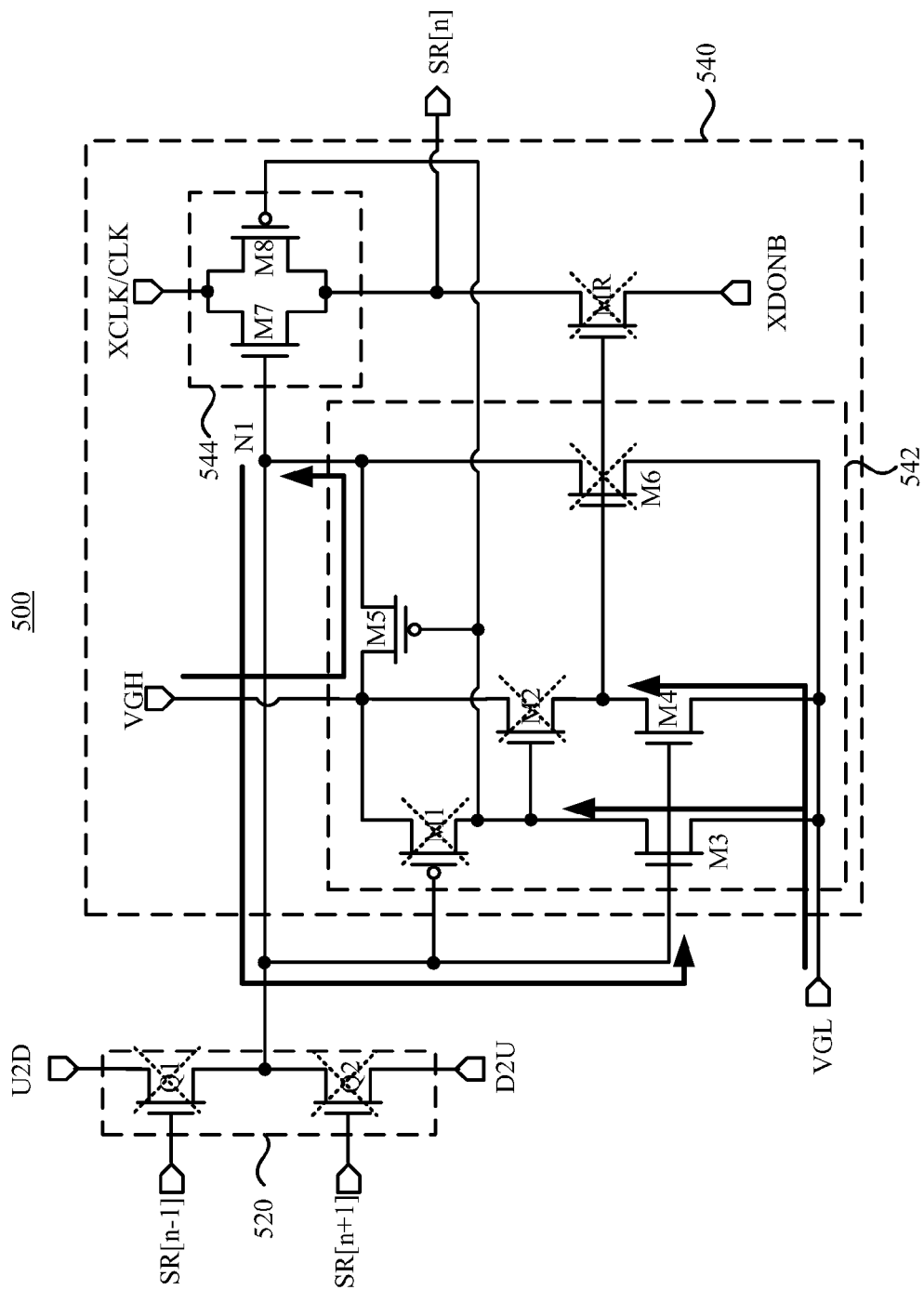
FIG. 8B is a schematic diagram of the state of each switch of the driving stage in FIG. 5 during time T2 according to one embodiment of the present disclosure.

FIG. 8B is a schematic diagram of the state of each switch of the driving stage in FIG. 5 during time T2 according to one embodiment of the present disclosure.

During time T2, as shown in FIG. 7 and FIG. 8B, the gate driving signal SR[n−1] outputted from (N−1)th driving stage switches to the disabling period (i.e., switches to the low level voltage signal), and the gate driving signal SR[n+1] outputted from (N+1)th driving stage still keeps at the disabling period. Therefore, the switch Q1 and the switch Q2 are turned off. As the voltage level of the control node N1 is already pulled up to the voltage VGH during time T1, the switch M3, the switch M4, and the switch M7 are kept being turned on. Thus, the voltage VGL keeps turning on the switch M5 through the switch M3, and keeps turning off the switch M6 and the reset switch MR through the switch M4. Accordingly, during time T2, the voltage level of the control node N1 can be kept the voltage VGH through the switch M5. Further, as the output unit 544 is turned on, the gate driving signal SR[n] outputted from the N-th driving stage 500 follows the clock signal XCLK to switch to the high level voltage signal.

Figure 8C:
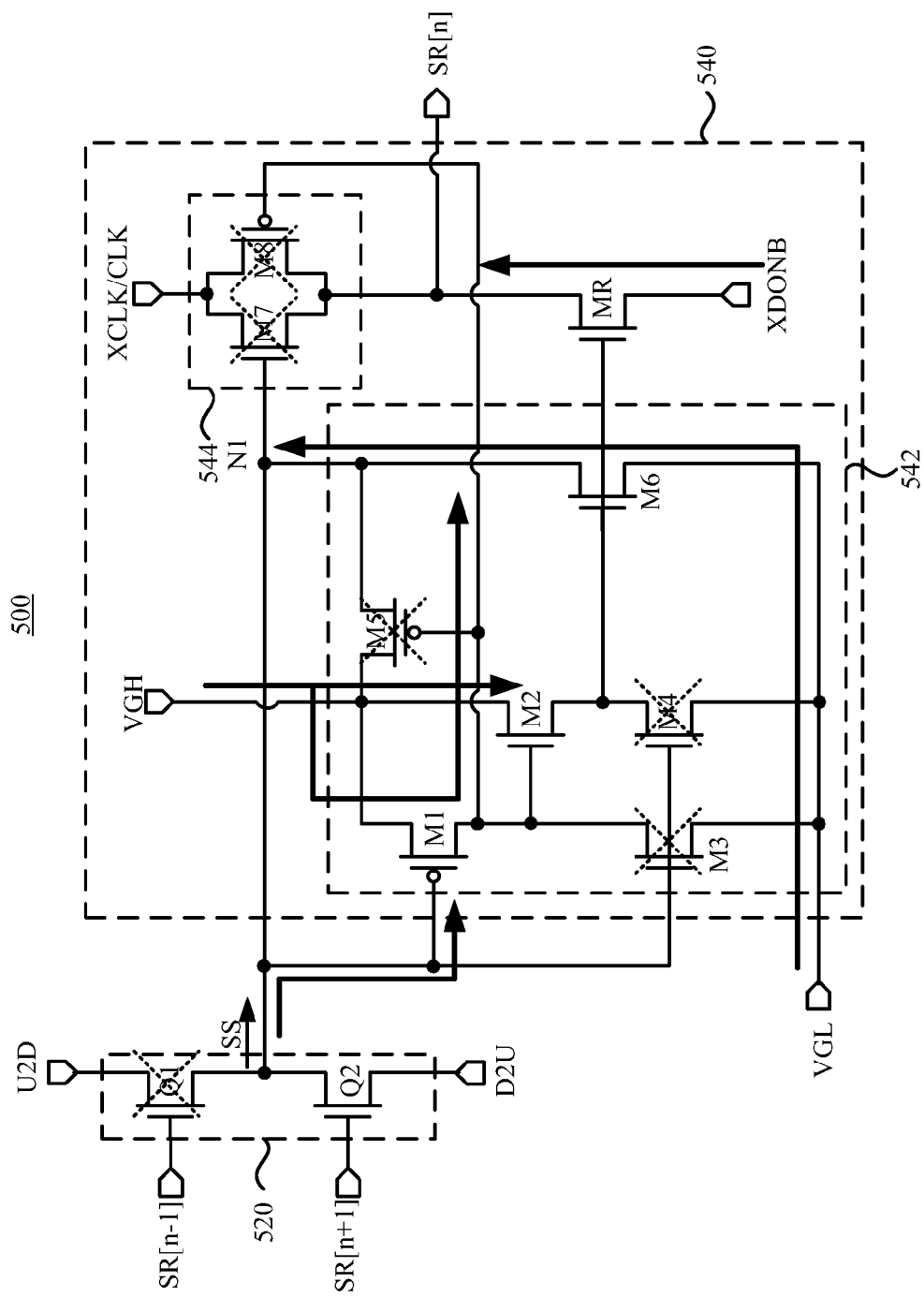
FIG. 8C is a schematic diagram of the state of each switch of the driving stage in FIG. 5 during time T3 according to one embodiment of the present disclosure.

FIG. 8C is a schematic diagram of the state of each switch of the driving stage in FIG. 5 during time T3 according to one embodiment of the present disclosure.

During time T3, as shown in FIG. 7 and FIG. 8C, the gate driving signal SR[n−1] outputted from (N−1)th driving stage switches to the low level voltage signal, and the gate driving signal SR[n+1] outputted from (N+1)th driving stage enters the enabling period (i.e., switches to the high voltage level signal). Meantime, the switch Q1 of the N-th driving stage 500 is turned off, the switch Q2 of the N-th driving stage 500 is turned on, and the upshift signal is outputted to the control node N1 as the shift signal SS.

As mentioned above, as the upshift signal D2U is the low level voltage signal, the shift signal SS also is the low level voltage signal by this time. Therefore, the switch M3 and the switch M4 are turned off, and the switch M1 is turned on. The voltage VGH is transmitted to the control terminal of the switch M2 through the switch M2, and thus the switch M2 is turned on. The voltage VGH is further transmitted to the control terminals of the switch M6 and the reset switch MR, and thus the switch M6 and the reset switch MR are turned on. During time T3, the voltage level of the control node N1 is steadily pulled down to the voltage VGL through the switch M6, and the switch M7 and the switch M8 are thus turned off. As mentioned above, in the normal operation, the power signal XDONB is the low level voltage signal. Therefore, during time T3, the gate driving signal SR[n] outputted from the N-th driving stage 500 follows the power signal XDONB to be the low level voltage signal.

As described above, during the enabling period of the gate driving signal SR[n−1] outputted from (N−1)th driving stage and the enabling period of the gate driving signal SR[n] outputted from N-th driving stage (i.e., time T1 and time T2 shown in FIG. 7), the voltage level of the control node N1 can be kept at the voltage VGH. During the enabling period of the gate driving signal SR[n+1] outputted from (N+1)th driving stage (i.e., time T3 shown in FIG. 7), the voltage level of the control node N1 can be switched and be kept at the voltage VGL. In other words, during the operating process, the voltage level of the control node N1 of the N-th driving stage 500 can be switched to and kept at a specific voltage, e.g., the voltage VGH or the voltage VGL, and thus the floating of the internal nodes of the circuit is prevented from impacts caused by process variations, aging, leakage current, or parasitic capacitances.

Figure 9:
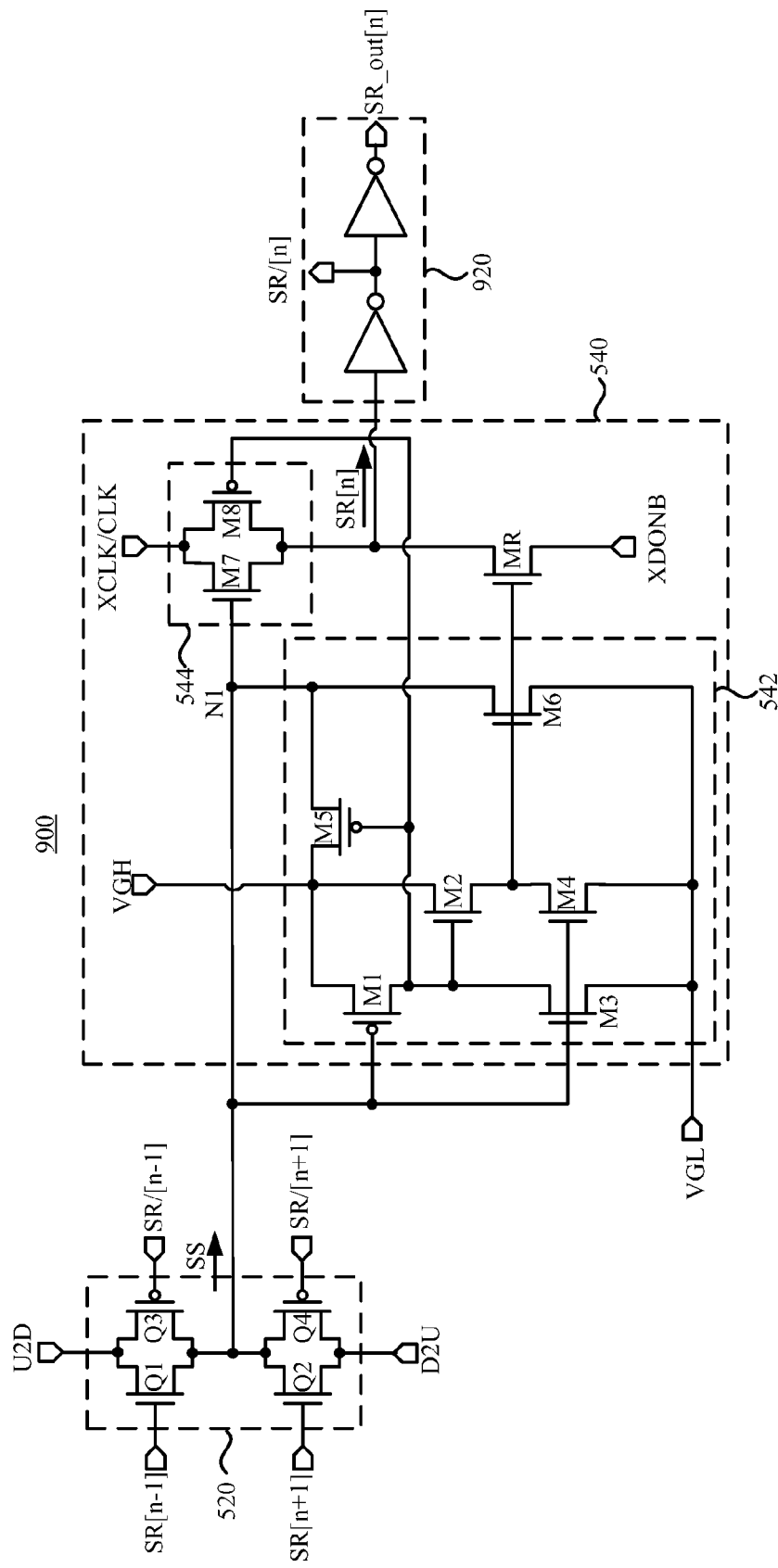
FIG. 9 is a schematic diagram of a driving stage 900 according to one embodiment of the present disclosure.

FIG. 9 is a schematic diagram of a driving stage 900 according to one embodiment of the present disclosure. Compared with the driving stage 500 shown in FIG. 5, the driving stage 900 further includes a buffer 920. The buffer 920 is configured to generate an output signal SR_out[n] having a better driving ability to the corresponding gate line according to the gate driving signal SR[n]. The buffer 920 can be arranged in the aforementioned driving stage 500 as well.

Compared with the driving stage 500 shown in FIG. 5, the input unit 520 of the driving stage 900 further includes a switch Q3 and a switch Q4. The switch Q3 is electrically coupled to the switch Q1 in parallel, and is configured to be selectively turned on according to a control signal SR/[n−1]. The switch Q4 is electrically coupled to the switch Q2 in parallel, and is configured to be selectively turned on according to a control signal SR/[n+1]. The control signal SR/[n−1] and the control signal SR/[n+1] can be generated from the buffer 920 (i.e., control signal SR/[n] shown in FIG. 9), in which the control signal SR/[n−1] and the gate driving signal SR[n−1] outputted from the (N−1)th driving stage 900 have opposite-phase, and the control signal SR/[n+1] and the gate driving signal SR[n+1] outputted from the (N+)th driving stage 900 have opposite-phase. The switch Q1 and the switch Q3 form a complementary switching unit, and the switch Q2 and the switch Q3 form another one complementary switching unit. The operations of the driving stage 900 are similar with the operations of the driving stage 500, and the repetitious descriptions are not given here.

In various embodiments of the present disclosure, each switch can be any type of transistors, such as a metal-oxide-semiconductor field-effect transistor (MOSFET), a bottom-gate transistor, a top-gate transistor, a thin film transistor, etc. The types of transistor are for illustrative purposes, and the present disclosure is not limited thereto.

Table 1 shows the simulated results of the power consumption and the threshold voltage of the conventional shift register circuit 100. In the table 1, Vtn indicates the threshold voltage of N type transistors in the conventional shift register circuit 100, Vtp indicates the threshold voltage of N type transistors in the conventional shift register circuit 100, and PW indicates the total power consumption of the conventional shift register circuit 100. in which the unit of the power consumption is milliwatts (mW).

TABLE 1

| | PW | | | | | | | |
|---|---|---|---|---|---|---|---|---|
| | | | | Vtn | | | | |
| Vtp | −1 V | 0 V | 1 V | 2 V | 3 V | 4 V | 5 V | 6 V |
| 1 V | 11.47 | 4.96 | 4.55 | 4.52 | 4.49 | 4.46 | 4.44 | 4.42 |
| 0 V | 7.03 | 2.44 | 2.23 | 2.25 | 2.21 | 2.18 | 2.15 | 2.13 |
| −1 V | 6.80 | 2.34 | 2.22 | 2.18 | 2.15 | 2.12 | 2.10 | 2.07 |
| −2 V | 6.76 | 2.30 | 2.18 | 2.16 | 2.12 | 2.09 | 2.07 | 2.04 |
| −3 V | 6.74 | 2.25 | 2.23 | 2.12 | 2.10 | 2.11 | 2.31 | 2.40 |
| −4 V | 6.71 | 2.21 | 2.12 | 2.10 | 2.10 | 2.10 | 2.30 | 2.06 |
| −5 V | 6.72 | 2.23 | 2.09 | 2.08 | 2.46 | 2.09 | 2.03 | 2.20 |
| −6 V | 6.70 | 2.13 | 2.06 | 2.09 | 2.25 | 2.13 | 2.24 | 1.97 |

Table 2 shows the simulated results of the power consumption and the threshold voltage of the driving stage 500 in FIG. 5. In the table 2, Vtn indicates the threshold voltage of N type transistors in the driving stage 500, Vtp indicates the threshold voltage of N type transistors in the driving stage 500, and PW indicates the total power consumption of the driving stage 500, in which the unit of the power consumption is milliwatts (mW).

TABLE 2

| | PW | | | | | | | |
|---|---|---|---|---|---|---|---|---|
| | | | | Vtn | | | | |
| Vtp | −1 V | 0 V | 1 V | 2 V | 3 V | 4 V | 5 V | 6 V |
| 1 V | 6.83 | 3.20 | 2.98 | 2.93 | 2.88 | 2.85 | 2.88 | 2.84 |
| 0 V | 5.33 | 2.45 | 2.33 | 2.28 | 2.24 | 2.21 | 2.10 | 2.06 |
| −1 V | 5.20 | 2.36 | 2.26 | 2.22 | 2.20 | 2.17 | 2.07 | 2.03 |
| −2 V | 5.15 | 2.29 | 2.21 | 2.18 | 2.16 | 2.14 | 2.05 | 2.01 |
| −3 V | 5.10 | 2.24 | 2.16 | 2.13 | 2.12 | 2.10 | 2.02 | 1.99 |
| −4 V | 5.06 | 2.17 | 2.21 | 2.08 | 2.07 | 2.06 | 1.99 | 1.96 |
| −5 V | 5.02 | 2.11 | 2.20 | 2.03 | 2.02 | 2.01 | 1.95 | 1.92 |
| −6 V | 4.97 | 2.04 | 1.98 | 1.97 | 1.98 | 1.97 | 1.90 | 1.88 |

According to the table 1 and the table 2, compared with the conventional shift register circuit 100, the power consumption of the driving stage 500 of the present disclosure and the power consumption of the conventional shift register circuit 100 are about the same when the threshold voltage is slightly varied. When the threshold voltage is significantly varied, e.g., Vtn is −1V and Vtp is 1V, the power consumption of the driving stage 500 is about 6.83 mW, and the power consumption of the conventional shift register circuit 100 is about 11.47 mW. In other words, compared with the conventional shift register circuit 100, the driving stage 500 can have more stable and much lower power consumption when the switches are varied.

In summary, the display panel, the gate driver, and the control method of the present disclosure can make the nodes of the internal circuits of the gate driver keep at a specific voltage during the entire operations, and the failed operations caused by floating voltage are thus prevented.

It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A display panel, comprising:
   a plurality of gate lines; and
   a gate driver, comprising a plurality of series-connected driving stages, wherein each of the driving stages is configured to output a gate driving signal to the corresponding one of the gate lines, an N-th driving stage of the driving stages comprising:
   an input unit configured to output a shift signal to a control node according to the gate driving signal outputted from an (N−1)th driving stage and the gate driving signal outputted from an (N+1)th driving stage, wherein N is a positive integer; and
   a shift register circuit electrically coupled to the control node, and configured to receive the shift signal to output the gate driving signal;
   wherein the shift register circuit is configured to pull a voltage level of the control node to a first voltage during an enabling period of the gate driving signal outputted from the (N−1)th driving stage, and to keep the voltage level of the control node being the same as the first voltage during an enabling period of the gate driving signal outputted from the N-th driving stage.

2. The display panel of claim 1, wherein the shift register circuit comprises:
   a control unit configured to pull up the voltage level of the control node to the first voltage or to pull down the voltage level of the control node to a second voltage according to the shift signal;
   a reset switch electrically coupled to the control unit, and configured to switch the gate driving signal to a high level voltage signal according to a power signal; and
   an output unit configured to output the gate driving signal according to the shift signal and a clock signal.

3. The display panel of claim 2, wherein the reset switch has a first terminal, a second terminal, and a control terminal, the first terminal of the reset switch is configured to output the gate driving signal, and the second terminal of the reset switch is configured to receive the power signal, the control unit comprising:
   a first switch having a first terminal, a second terminal, and a control terminal, wherein the control terminal of the first switch is electrically coupled to the control node, and the first terminal of the first switch is configured to receive the first voltage;
   a second switch having a first terminal, a second terminal, and a control terminal, wherein the control terminal of the second switch is electrically coupled to the second terminal of the first switch, the first terminal of the second switch is electrically coupled to the first terminal of the first switch, and the second terminal of the second switch is electrically coupled to the control terminal of the reset switch;
   a third switch having a first terminal, a second terminal, and a control terminal, wherein the control terminal of the third switch is electrically coupled to the control node, the first terminal of the third switch is electrically coupled to the second terminal of the first switch, and the second terminal of the third switch is configured to receive the second voltage;
   a fourth switch having a first terminal, a second terminal, and a control terminal, wherein the control terminal of the fourth switch is electrically coupled to the control node, the first terminal of the fourth switch is electrically coupled to the second terminal of the second switch, and the second terminal of the fourth switch is configured to receive the second voltage;

a fifth switch having a first terminal, a second terminal, and a control terminal, wherein the control terminal of the fifth switch is electrically coupled to the second terminal of the first switch, the first terminal of the fifth switch is electrically coupled to the first terminal of the first switch, and the second terminal of the fifth switch is electrically coupled to the control node; and a sixth switch having a first terminal, a second terminal, and a control terminal, wherein the control terminal of the sixth switch is electrically coupled to the second terminal of the second switch, the first terminal of the sixth switch is electrically coupled to the control node, and the second terminal of the sixth switch is configured to receive the second voltage.

4. The display panel of claim 3, wherein the output unit comprises:

a seventh switch having a first terminal, a second terminal, and a control terminal, wherein the control terminal of the seventh switch is electrically coupled to the control node, the first terminal of the seventh switch is configured to receive the clock signal, and the second terminal of the seventh switch is electrically coupled to the first terminal of the reset switch; and an eighth switch having a first terminal, a second terminal, and a control terminal, wherein the control terminal of the eighth switch is electrically coupled to the second terminal of the first switch, the first terminal of the eighth switch is configured to receive the clock signal, and the second terminal of the eighth switch is electrically coupled to the first terminal of the reset switch.

5. The display panel of claim 2, wherein the reset switch has a first terminal, a second terminal, and a control terminal, the first terminal of the reset switch is configured to output the gate driving signal, and the second terminal of the reset switch is configured to receive the power signal, the output unit comprising:

a first switch having a first terminal, a second terminal, and a control terminal, wherein the control terminal of the first switch is electrically coupled to the control node, the first terminal of the first switch is configured to receive the clock signal, and the second terminal of the first switch is electrically coupled to the first terminal of the reset switch; and a second switch having a first terminal, a second terminal, and a control terminal, wherein the control terminal of the second switch is electrically coupled to the control unit, the first terminal of the second switch is configured to receive the clock signal, and the second terminal of the second switch is electrically coupled to the first terminal of the reset switch.

6. The display panel of claim 1, wherein the input unit comprises:

a first switch having a first terminal, a second terminal, and a control terminal, wherein the control terminal of the first switch is configured to receive the gate driving signal outputted from the (N−1)th driving stage, the first terminal of the first switch is configured to receive a downshift signal, and the second terminal of the first switch is configured to output the shift signal to the control signal; and a second switch having a first terminal, a second terminal, and a control terminal, wherein the control terminal of the second switch is configured to receive the gate driving signal outputted from the (N+1)th driving stage, the first terminal of the second switch is electrically coupled to the second terminal of the first switch, and the second terminal of the second switch is configured to receive a upshift signal.

7. The display panel of claim 6, wherein the input unit further comprises:

a third switch electrically coupled to the first switch in parallel, and configured to be selectively turned on according to a first control signal, wherein the gate driving signal outputted from the (N−1)th driving stage and the first control signal have opposite phase; and a fourth switch electrically coupled to the second switch in parallel, and configured to be selectively turned on according to a second control signal, wherein the gate driving signal outputted from the (N+1)th driving stage and the second control signal have opposite phase.

8. A control method, suitable for a gate driver, the gate driver comprising a plurality of series-connected driving stages, each of the driving stages comprising an input unit and a shift register circuit, the input unit and the shift register circuit being electrically coupled to a control node, the shift register circuit being configured to output a gate driving signal, the control method comprising:

turning on the input unit to transmit a downshift signal to the control node by the gate driving signal outputted from a previous driving stage;

turning on a first switch of the shift register circuit to transmit a first voltage to turn on a second switch by the downshift signal;

pulling up a voltage level of the control node to a second voltage through the second switch during an enabling period of the gate driving signal outputted from the previous driving stage; and keeping the voltage level of the control node being the same as the second voltage through the second switch during an enabling period of the gate driving signal outputted from a current driving stage.

9. The control method of claim 8, further comprising:

turning on the input unit by the gate driving signal outputted from a next driving stage, so as to transmit a upshift signal to the control node;

turning on a third switch of the shift register by the upshift signal, so as to transmit the second voltage to turn on a fourth switch and a fifth switch; and pulling down the voltage level of the control node to the first voltage through the fifth switch during the enabling period of the gate driving signal outputted from the next driving stage.

10. A gate driver, comprising:

a plurality of series-connected driving stages, wherein each of the driving stages is configured to output a gate driving signal, and an N-th driving stage of the driving stages comprises:

a shift register circuit configured to output the gate driving signal in response to a voltage level of a control node, wherein the voltage level of the control node is adjusted according to the gate driving signal outputted from an (N−1)th driving stage and the gate driving signal outputted from an (N+1)th driving stage, and N is a positive integer, wherein the shift register circuit comprises a switch, the switch is configured to be turned on to transmit a first voltage to the control node during an enabling period of the gate driving signal outputted from the (N−1)th driving stage and an enabling period of the gate driving signal outputted from the N-th driving stage.

11. The gate driver of claim 10, wherein the voltage level of the control node is kept, by the switch, being the same as the first voltage during the enabling period of the gate driving signal outputted from the (N−1)th driving stage and the enabling period of the gate driving signal outputted from the N-th driving stage.

12. The gate driver of claim 10, wherein the switch is configured to be turned on based on the voltage level of the control node.

13. The gate driver of claim 10, wherein the switch is configured to directly receive the first voltage.

\* \* \* \* \*